US012677407B2

(12) United States Patent
Sakui et al.

(10) Patent No.: US 12,677,407 B2
(45) Date of Patent: Jul. 7, 2026

(54) MEMORY DEVICE USING SEMICONDUCTOR ELEMENT

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 140 days.

(21) Appl. No.: 18/900,034

(22) Filed: Sep. 27, 2024

(65) Prior Publication Data

US 2025/0120062 A1      Apr. 10, 2025

(30) Foreign Application Priority Data

Oct. 6, 2023      (WO) .................. PCT/JP2023/036523

(51) Int. Cl.
*G11C 11/4096*      (2006.01)
*G11C 11/4094*      (2006.01)
(Continued)

(52) U.S. Cl.
CPC .......... *H10B 12/20* (2023.02); *G11C 11/4094* (2013.01); *G11C 11/4096* (2013.01); *G11C 11/4097* (2013.01)

(58) Field of Classification Search
CPC ............................ G11C 11/4096; H10B 12/20
See application file for complete search history.

(56) References Cited

U.S. PATENT DOCUMENTS

2003/0111681 A1      6/2003      Kawanaka
2006/0157738 A1      7/2006      Kawanaka
(Continued)

FOREIGN PATENT DOCUMENTS

JP      H 02-188966  A      7/1990
JP      03-171768  A      7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Densitiy LSI's" IEEE Transaction on Electron Devices, vol. 38, No. 3, pp. 573-578 (1991) (6 pages).

(Continued)

*Primary Examiner* — Jason Lappas
(74) *Attorney, Agent, or Firm* — Crowell & Moring LLP

(57)      ABSTRACT

A plurality of dynamic flash memory cells are arranged in a matrix shape on a substrate, a first dynamic flash memory cell and a second dynamic flash memory cell overlap each other in a vertical or horizontal direction of the substrate, voltages applied to a selection gate line, a plate line, and a bit line which are common to the first and second dynamic flash memory cells, an independent first source line, and an independent second source line are controlled to perform a data erase operation on the first and second dynamic flash memory cells, a data write operation on one of the first and second dynamic flash memory cells, a data write-protect operation on another of the first and second dynamic flash memory cells, and a data read operation on one of the first and second dynamic flash memory cells.

15 Claims, 12 Drawing Sheets

(51) Int. Cl.
  *G11C 11/4097* (2006.01)
  *H10B 12/00* (2023.01)

(56) References Cited

U.S. PATENT DOCUMENTS

| | | | | |
|---|---|---|---|---|
| 2008/0137394 | A1 | 6/2008 | Shimano et al. | |
| 2020/0135863 | A1 | 4/2020 | Han et al. | |
| 2022/0367467 | A1* | 11/2022 | Harada | H10B 12/20 |
| 2022/0367473 | A1 | 11/2022 | Sakui et al. | |
| 2022/0367681 | A1 | 11/2022 | Harada et al. | |
| 2023/0106561 | A1 | 4/2023 | Hsu | |
| 2023/0186966 | A1 | 6/2023 | Shirota et al. | |
| 2023/0290404 | A1 | 9/2023 | Kakumu et al. | |

FOREIGN PATENT DOCUMENTS

| | | | |
|---|---|---|---|
| JP | 2003-188279 | A | 7/2003 |
| JP | 2008-147514 | | 6/2008 |
| JP | 7057032 | B1 | 4/2022 |
| WO | WO 2022/239237 | A1 | 11/2022 |
| WO | WO 2023/112122 | A1 | 6/2023 |
| WO | WO 2023/170782 | A1 | 9/2023 |

OTHER PUBLICATIONS

H. Chung, H. Kim, H. Kim, K. Kim, S. Kim, K. W.Song, J. Kim, Y.C. Oh, Y. Hwang, H. Hong, G. Jin, and C. Chung: "Novel 4F2 Dram Cell with Vertical Pillar Transistor(VPT)," 2011 Proceeding of the European Solid-State Device Research Conference, (2011) (4 pages).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010) (27 pages).

K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007) (4 pages).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015) (9 pages).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electrons," IEEE Electron Device Letter, vol. 31, No. 5, pp. 405-407 (2010) (3 pages).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012) (3 pages).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006) (4 pages).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697,Apr. 2006. (6 pages).

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007) (7 pages).

K. Sakui, N. Harada, "Dynamic Flash Memory with Dual Gate Surrounding Gate Transistor (SGT)," Proc. IEEE IMW, pp. 72-75 (2021) (2 pages).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002) (13 pages).

K. Sakui, Y. Li, M. Kakumu, K. Kanazawa, I. Kunishima, Y. Iwata, and N. Harada, "Design Impact on Three Gate Dynamic Flash Memory (3G_DFM) for Long Hole Retention Time and Robust Disturbance Shield," Memories—Materials, Devices, Circuits and Systems, Elsevier, 4, 100054, pp. 1-5, May 2023 (5 pages).

W.-C. Chen, H.-T. Lue, M.-Y. Wu, T.-H. Yeh, P.-Y. Du, T.-H. Hsu, C.-C. Hsieh, K.-C. Wang, and C.-Y. Lu, "A 3D Stackable DRAM: Capacitor-less Three-Wordline Gate-Controlled Thyristor (GCT) RAM with >40µA Current Sensing Window, >1010 Endurance, and 3-second Retention at Room Temperature," in IEEE IEDM (International Electron Devices Meeting), pp. 607-610, Dec. 2022. (4 pages).

W.-C. Chen, H.-T. Lue, T.-H. Hsu, K.-C. Wang, and C.-Y. Lu, "A Simulation Study of Scaling Capability toward 10nm for the 3D Stackable Gate-Controlled Thyristor (GCT) DRAM Device," in IEEE IMW (International Memory Workshop), pp. 25-28, May 2023 (4 pages).

M. Huang, S. Si, Z. He, Y. Zhou, S. Li, H. Wang, J. Liu, D. Xie, M. Yang, K. You, C. Choi, Y. Tang, X. Li, S. Qian, X. Yang, L. Hou, W. Bai, Z. Liu, Y. Tang, Q. Wu, Y. Wang, T. Dou, J. Kim, G.-L. Wang, J. Bai, A. Takao, C. Zhao, A. Yoo, M. Zhou, "A 3D Stackable 1T1C DRAM: Architecture, Process Integration and Circuit Simulation," in IEEE IMW (International Memory Workshop), pp. 29-32, May 2023 (4 pages).

J.W. Han, S.H. Park, M.Y. Jeong, K.S. Lee, K.N. Kim, H.J. Kim, J.C. Shin, S.M. Park, S.H. Shin, S.W. Park, K.S. Lee, J.H. Lee, S.H. Kim, B.C Kim, M.H. Jung, I.Y. Yoon, H. Kim, S.U. Jang, K.J. Park, Y.K. Kim, I.G. Kim, J.H Oh, S.Y. Han, B.S. Kim, B.J. Kuh, and J.M. Park, "Ongoing Evolution of DRAM Scaling via Third Dimension-Vertically Stacked DRAM" in 2023 Symposium on VLSI Technology and Circuits Digest of Technical Papers, TFS1-1, pp. 1-2, Jun. 2023 (2 pages).

K. Sakui, and N. Harada, "Read Non-Destructive Dynamic Flash Memory (DFM) with Dual and Double Gates," Extended Abstracts of the 2022 International Conference on Solid State Devices and Materials, pp. 405-406, Sep. 2022 (2 pages).

International Search Report and Written Opinion in International Application No. PCT/JP2023/036523 )in Japanese) completed on Dec. 12, 2023 (9 pages).

\* cited by examiner

FIG. 3A
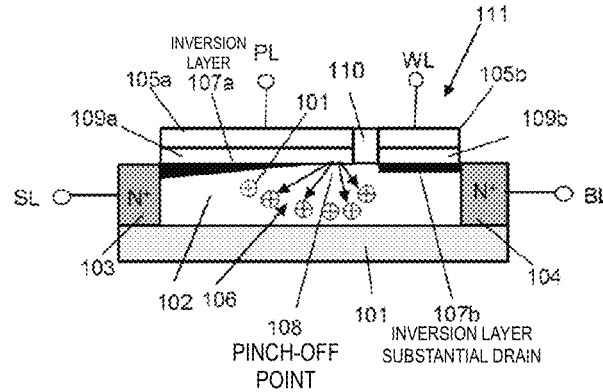
FIG. 3B
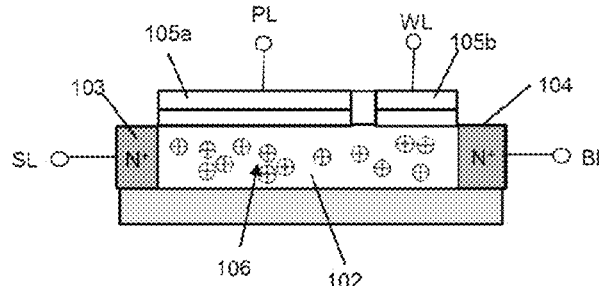
FIG. 3C
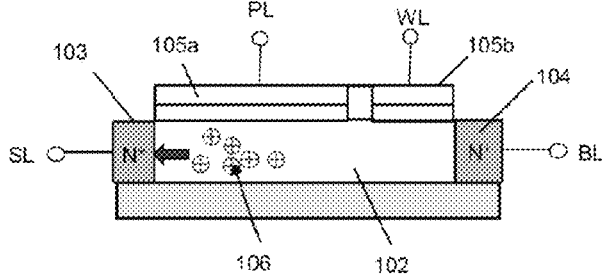
FIG. 3D

MEMORY DEVICE USING SEMICONDUCTOR ELEMENT

CROSS-REFERENCE TO RELATED APPLICATIONS

This application claims priority to PCT/JP2023/036523, filed Oct. 6, 2023, the entire content of which is incorporated herein by reference.

BACKGROUND OF THE INVENTION

1. Field of the Invention

The present invention relates to a memory device using a semiconductor element.

2. Description of the Related Art

Today, in technical development of large scale integration (LSI), there is a demand for higher integration and higher performance of memory elements.

The integration of the memory elements is being increased and the performance of the memory elements is being improved. There are, for example, the following memory elements: a dynamic random access memory (DRAM) that uses a surrounding gate transistor (SGT) as a selection transistor to which a capacitor is connected (for the SGT, see Japanese Unexamined Patent Application Publication No. 2-188966, and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991); for the DRAM, see, for example, H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)); a phase change memory (PCM) to which a resistance change element is connected (see, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No 12, December, pp. 2201-2227 (2010)); a resistive random access memory (RRAM, see, for example, K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V", IEDM (2007)); and a magneto-resistive random access memory (MRAM) that changes the resistance by changing the direction of magnetic spin with a current (see, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)).

There also is a capacitorless DRAM cell including a single metal oxide semiconductor (MOS) transistor or the like (see Japanese Unexamined Patent Application Publication No. 3-171768, M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010), J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Capacitorless 1T-DRAM Technology Using Gate-Induced Drain-Leakage (GIDL) Current for Low-Power and High-Speed Embedded Memory", IEEE IEDM (2006)). In the DRAM cell including a single MOS transistor, for example, part or the entirety of a positive hole group out of the positive hole group and an electron group generated in a channel by impact ionization due to a current between a source and a drain of an N-channel MOS transistor is held in the channel to write logical storage data "1". Logical storage data "0" is written by discharging the positive hole group from the channel. As memory cells, the memory cell for writing "1" and the memory cell for writing "0" are randomly provided with a shared selection word line. When an ON voltage is applied to the selection word line, a floating body channel voltage of the selection memory cell continuous with this selection word line significantly fluctuates due to capacitive coupling between the gate electrode and the channel. Regarding this memory cell, the following tasks arise: suppressing reduction of an operation margin due to voltage fluctuation of the floating body channel; and reduction of degradation of data retention due to discharging of part of the positive hole group serving as signal charges stored in the channel.

There also is a twin-transistor MOS memory element in which a single memory cell is formed by using two MOS transistors in a silicon on insulator (SOI) layer (see, for example, U.S. Patent Application Publication No. 2008/0137394 A1, U.S. Patent Application Publication No. 2003/0111681 A1, and F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., Vol. E90-c., No. 4 pp. 765-771 (2007)). In these elements, an N$^+$ layer serving as a source or a drain that separates floating body channels of the two MOS transistors is formed so as to be in contact with an insulating layer provided on the substrate side. With this N$^+$ layer, the floating body channels of two MOS transistors are electrically isolated. A positive hole group serving as signal charges is stored only in the floating body channel of one of the MOS transistors. The other MOS transistor serves as a switch for reading the positive hole group of the signal stored in the one of the MOS transistors. Also in this memory cell, since the positive hole group serving as the signal charges is stored in the channel of a single MOS transistor, the following task arises as is the case with the above-described memory cell including a single MOS transistor: suppressing reduction of the operation margin; or reduction of degradation of the data retention due to discharging of part of the positive hole group serving as the signal charges stored in the channel.

There also is a capacitorless dynamic flash memory (DFM) cell 111 illustrated in FIGS. 3A to 3D that includes a MOS transistor (see Japanese Patent No. 7057032 and K. Sakui, and N. Harada, "Dynamic Flash Memory with Dual Gate Surrounding Gate Transistor (SGT)", Proc. IEEE IMW, pp. 72-75 (2021)). As illustrated in FIG. 3A, a floating body semiconductor base 102 is provided on an $SiO_2$ layer 101 of a SOI substrate. An $N^+$ layer 103 connected to a source line SL and an $N^+$ layer 104 connected to a bit line BL are respectively provided at one end and the other end of the floating body semiconductor base 102. A first gate insulating layer 109a and a second gate insulating layer 109b are also provided. The first gate insulating layer 109a is continuous with the $N^+$ layer 103 and covers the floating body semiconductor base 102. The second gate insulating layer 109b is continuous with the $N^+$ layer 104 and the first gate insulating layer 109a via a slit insulating film 110 and covers the floating body semiconductor base 102. Also, a first gate conductor layer 105a and a second gate conductor layer 105b are provided. The first gate conductor layer 105a covers the first gate insulating layer 109a and is continuous with a plate line PL. The second gate conductor layer 105b covers the second gate insulating layer 109b and is continuous with a word line WL. The slit insulating film 110 is provided between the first gate conductor layer 105a and the second gate conductor layer 105b. Thus, the memory cell 111 of a DFM is formed. The source line SL and the bit line BL may be respectively connected to the $N^+$ layer 104 and the $N^+$ layer 103.

As illustrated in FIG. 3A, for example, a zero voltage is applied to the $N^+$ layer 103 and a positive voltage is applied to the $N^+$ layer 104 so as to cause a first N-channel MOS transistor region including the floating body semiconductor base 102 covered with the first gate conductor layer 105a to operate in a saturation region and cause a second N-channel MOS transistor region including the floating body semiconductor base 102 covered with the second gate conductor layer 105b to operate in a linear region. As a result, no pinch-off point exists in the second N-channel MOS transistor region, and an inversion layer 107b is formed throughout a surface. The inversion layer 107b formed on the lower side of the second gate conductor layer 105b connected to the word line WL operates as a substantial drain of the first N-channel MOS transistor region. As a result, an electric field is maximized in a boundary region of the semiconductor base between the first N-channel MOS transistor region and the second N-channel MOS transistor region, thereby impact ionization is produced in this region. Then, as illustrated in FIG. 3B, an electron group out of the electron group and a positive hole group generated by the impact ionization is discharged from the floating body semiconductor base 102, and part or the entirety of a positive hole group 106 is held in the floating body semiconductor base 102 so as to perform a memory write operation. This state is the logical storage data "1".

As illustrated in FIG. 3C, for example, an erase operation is performed by applying a positive voltage to the plate line PL, a zero voltage to the word line WL and the bit line BL, and a negative voltage to the source line SL so as to discharge the positive hole group 106 from the floating body semiconductor base 102. This state is the logical storage data "0". In data reading, a characteristic with which no current flows even when the voltage of the word line WL is increased in reading of the logical storage data "0" as illustrated in FIG. 3D can be obtained by setting a voltage applied to the first gate conductor layer 105a continuous with the plate line PL to be higher than a threshold voltage at the time of the logical storage data "1" and lower than a threshold voltage at the time of logical storage data "0". Due to this characteristic, the operation margin can be significantly increased compared to the case of the capacitorless DRAM cell including a single MOS transistor. In this memory cell, the channels of the first and second N-channel MOS transistor regions using, as the gates, the first gate conductor layer 105a continuous with the plate line PL and the second gate conductor layer 105b continuous with the word line WL are continuous in the floating body semiconductor base 102. Thus, voltage fluctuation of the floating body semiconductor base 102 occurring when a selection pulse voltage is applied to the word line WL is significantly suppressed. This greatly suppresses the reduction of the operation margin which arises the problem in the above-described memory cell or greatly reduces the problem of degradation of data retention due to discharging of part of the positive hole group serving as signal charges stored in the channel. From this time, further improvement of the characteristics is demanded of this memory element.

There also is a known capacitorless dynamic flash memory cell 8 illustrated in FIG. 4 that includes a MOS transistor and three gates (see U.S. Patent Application Publication No. 2023/0186966 A1 and K. Sakui, Y. Li, M. Kakumu, K. Kanazawa, I. Kunishima, Y. Iwata, and N. Harada, "Design Impact on Three Gate Dynamic Flash Memory (3G_DFM) for Long Hole Retention Time and Robust Disturbance Shield", in Memories-Materials, Devices, Circuits and Systems, Elsevier, 4, 100054, pp. 1-5, May 2023). A silicon semiconductor pillar (Si pillar) 2 is provided on a substrate 1. The Si pillar 2 includes an $N^+$ layer 3a, a P layer 7, and an $N^+$ layer 3b in this order from below. The P layer 7 between the $N^+$ layers 3a and 3b serves as a channel region 7a. A first gate insulating layer 4a, a second gate insulating layer 4b, and a third gate insulating layer 4c are provided in this order from below so as to surround the Si pillar 2. A first gate conductor layer 5a is provided so as to surround the first gate insulating layer 4a, a second gate conductor layer 5b is provided so as to surround the second gate insulating layer 4b, and a third gate conductor layer 5c is provided so as to surround the third gate insulating layer 4c. The first gate conductor layer 5a and the second gate conductor layer 5b are isolated from each other by an insulating layer 6a, and the second gate conductor layer 5b and the third gate conductor layer 5c are isolated from each other by an insulating layer 6b. Thus, the dynamic flash memory cell including the following layers are formed: the $N^+$ layers 3a and 3b; the P layer 7; the first gate insulating layer 4a, the second gate insulating layer 4b, and the third gate insulating layer 4c; and the first gate conductor layer 5a, the second gate conductor layer 5b, and the third gate conductor layer 5c. As a feature of this structure, recombination of the positive hole group stored in the channel region 7a between the $N^+$ layers 3a and 3b is significantly suppressed in the $N^+$ layers 3a and 3b due to utilization of electrical shielding between the first gate conductor layer 5a and the third gate conductor layer 5c. As a result, the retention of the data "1" is significantly improved. The dynamic flash memory cells may be provided parallel to the substrate 1 so as to laminate a plurality of memory cells in the perpendicular direction. This can increase the degree of integration (see U.S. Patent Application Publication No. 2022/0367681 A1). The first gate conductor layer 5a, the second gate conductor layer 5b, and the third gate conductor layer 5c may be divided (see, for example, U.S. Patent Application Publication No. 2022/0367473 A1 and K. Sakui, and N. Harada, "Read Non-Destructive Dynamic Flash Memory (DFM) with Dual and Double Gates", Extended Abstracts of the 2022 International Conference on Solid State Devices and Materials, pp. 405-406, September 2022).

There also are publications of a capacitorless thyristor RAM including three gates (see W. C. Chen, H. T. Lue, M.

Y. Wu, T. H. Yeh, P. Y. Du, T. H. Hsu, C. C. Hsieh, K. C. Wang, and C. Y. Lu, "A 3D Stackable DRAM: Capacitorless Three-Wordline Gate-Controlled Thyristor (GCT) RAM with >40 μA Current Sensing Window, >1010 Endurance, and 3-second Retention at Room Temperature", in IEEE IEDM (International Electron Devices Meeting), pp. 607-610, December 2022 and W. C. Chen, H. T. Lue, T. H. Hsu, K. C. Wang, and C. Y. Lu, "A Simulation Study of Scaling Capability toward 10 nm for the 3D Stackable Gate-Controlled Thyristor (GCT) DRAM Device", in IEEE IMW (International Memory Workshop), pp. 25-28, May 2023). This thyristor memory has an advantage in that a plurality of layers can be laminated so as to reduce an equivalent memory size. However, since the thyristor is used as a reading mechanism, a reading current value is significantly increases and decreases. As a result, power consumption increases.

There also are publications of a 1T1C DRAM cell including a capacitor that can be laminated (see M. Huang, S. Si, Z. He, Y. Zhou, S. Li, H. Wang, J. Liu, D. Xie, M. Yang, K. You, C. Choi, Y. Tang, X. Li, S. Qian, X. Yang, L. Hou, W. Bai, Z. Liu, Y. Tang, Q. Wu, Y. Wang, T. Dou, J. Kim, G. L. Wang, J. Bai, A. Takao, C. Zhao, A. Yoo, M. Zhou, "A 3D Stackable 1T1C DRAM: Architecture, Process Integration and Circuit Simulation", in IEEE IMW (International Memory Workshop), pp. 29-32, May 2023 and J. W. Han, S. H. Park, M. Y. Jeong, K. S. Lee, K. N. Kim, H. J. Kim, J. C. Shin, S. M. Park, S. H. Shin, S. W. Park, K. S. Lee, J. H. Lee, S. H. Kim, B. C Kim, M. H. Jung, I. Y. Yoon, H. Kim, S. U. Jang, K. J. Park, Y. K. Kim, I. G. Kim, J. H Oh, S. Y. Han, B. S. Kim, B. J. Kuh, and J. M. Park, "Ongoing Evolution of DRAM Scaling via Third Dimension-Vertically Stacked DRAM", in 2023 Symposium on VLSI Technology and Circuits Digest of Technical Papers, TFS1-1, pp. 1-2, June 2023). However, the aspect ratio of the capacitor of the DRAM cell is 50, which is large. Since the area of this capacitor is very large, when the DRAM cell is horizontally disposed, for example, as many as 200 layers are required to be laminated to obtain an equivalent area of an economical memory cell such as existing vertically disposed DRAM cell.

There also is a proposal of lamination of capacitorless DRAM cells each including a single MOS transistor (see U.S. Patent Application Publication No. 2023/0106561 A1). A problem arises with this structure in that, when an ON voltage is applied to the above-described selection word line, a floating body channel voltage of the selection memory cell continuous with this selection word line significantly fluctuates due to capacitive coupling between the gate electrode and the channel. Furthermore, as illustrated in FIG. 1F of U.S. Patent Application Publication No. 2023/0106561 A1, for example, a common floating body FBI is controlled with two word lines WL0 and WL1. Thus, a problem of selectivity arises. As a countermeasure, a method in which, as illustrated in FIG. 1G, alternate word lines are grounded as shielded lines is indicated. However, there arises a problem with this method in that memory capacity is halved and the cost is doubled.

SUMMARY OF THE INVENTION

In a dynamic flash memory cell, realization of a memory cell having a smaller effective cell size is demanded.

To address the above-described problems, in a memory device according to a first aspect of the present invention, a plurality of semiconductor memory cells including a first memory cell and a second memory cell are arranged on a substrate in a matrix shape on a substrate. The first memory cell includes a first semiconductor base extending in a first direction parallel to the substrate. The second memory cell includes a second semiconductor base separated from the first semiconductor base in a vertical direction or a horizontal direction. The second semiconductor base overlaps the first semiconductor base in plan view when the second semiconductor base is separated from the first semiconductor base in the vertical direction. The second semiconductor base is at a position overlapping the first semiconductor base in sectional view when the second semiconductor base is separated from the first semiconductor base in the horizontal direction. The memory device includes a first impurity region and a second impurity region respectively continuous with one end and another end of the first semiconductor base, a third impurity region and a fourth impurity region respectively continuous with one end and another end of the second semiconductor base, a first gate insulating layer in contact with a side surface out of side surfaces of the first semiconductor base facing the second semiconductor base, a second gate insulating layer in contact with a side surface out of side surfaces of the second semiconductor base facing the first semiconductor base, and a first gate conductor layer and a second gate conductor layer. The first gate conductor layer is in contact with the first and second gate insulating layers. The second gate conductor layer is in contact with the first and second gate insulating layers. The first gate conductor layer and the second gate conductor layer are arranged in the first direction and isolated from each other. Voltages applied to the first to fourth impurity regions and the first and second gate conductor layers are controlled so as to perform a data write operation that causes part or an entirety of a positive hole group or an electron group serving as a major carrier to remain in the first or second semiconductor base. The positive hole group or the electron group is generated by impact ionization due to a current flowed through one of the first and second semiconductor bases or a gate induced drain leakage current, a data write-protect operation, on another of the first and second semiconductor bases during the data write operation, that prohibits, by not causing the impact ionization or not flowing the gate induced drain leakage current, remaining of the part or the entirety of the positive hole group or the electron group serving as the major carrier in the first or second semiconductor base, a data erase operation that discharges the remaining positive hole group or the remaining electron group from one or both of the first and second impurity regions and one or both of the third and fourth impurity regions, and a data read operation that, by using storage data of a data write state or a data erase state of one of the first and second semiconductor bases, causes the current to flow through the first or second semiconductor base or prohibits flowing of the current through the first or second semiconductor base.

According to a second aspect of the present invention, in the above-described first aspect of the present invention, the first impurity region is connected to a first source line, the third impurity region is connected to a second source line, and the second and fourth impurity regions are connected to a bit line. One of the first gate conductor layer and the second gate conductor layer is connected to a first selection gate line and another of the first gate conductor layer and the second selection gate layer is connected to a plate line. Voltages applied to the first and second source lines, the bit line, the plate line, and a selection gate line are controlled so as to perform the data erase operation, the data write operation, and the data read operation.

According to a third aspect of the present invention, in the above-described second aspect of the present invention, in the data write-protect operation, the voltage applied to the first or second source line and the voltage applied to the bit line are identical to each other.

According to a fourth aspect of the present invention, in the above-described second aspect of the present invention, in the data read operation, the voltage applied to the first or second source line and the voltage applied to the bit line are identical to each other.

According to a fifth aspect of the present invention, in the above-described second aspect of the present invention, the first and second semiconductor bases overlap each other in sectional view of the substrate, and the plate line and the selection gate line are disposed parallel to the substrate such that the plate line and the selection gate line are perpendicular to the substrate in plan view.

According to a sixth aspect of the present invention, in the above-described second aspect of the present invention, the bit line is perpendicular to the plate line and the selection gate line in perpendicular sectional view relative to the substrate, and the first and second source lines are perpendicularly disposed in plan view so as to be parallel to the plate line and the selection gate line.

According to a seventh aspect of the present invention, in the above-described second aspect of the present invention, the first and second semiconductor bases overlap each other in plan view of the substrate, and the plate line and the selection gate line are disposed parallel to the substrate such that the plate line and the selection gate line are perpendicular to the substrate in sectional view.

According to an eighth aspect of the present invention, in the above-described second aspect of the present invention, the bit line is perpendicular to the plate line and the selection gate line in plan view relative to the substrate, and the first and second source lines are perpendicularly disposed in sectional view so as to be parallel to the plate line and the selection gate line.

According to a ninth aspect of the present invention, in the above-described second aspect of the present invention, the first selection gate line includes an isolated second selection gate line and an isolated third selection gate line, one of the first gate conductor layer and the second gate conductor layer is divided into two gate conductor layers, one of the divided gate conductor layers is connected to the second selection gate line and another of the divided gate conductor layers is connected to the third selection gate line, the first gate conductor layer or the second gate conductor layer that has not been divided is connected to the plate line, and the gate conductor layer connected to the second selection gate line and the gate conductor layer connected the third selection gate line are disposed on one side and another side of the gate conductor layer connected to the plate line.

According to a tenth aspect of the present invention, in the above-described ninth aspect of the present invention, a channel length of the gate conductor layer connected to the plate line is greater than a channel length of the gate conductor layer connected to the second selection gate line and a channel length of the gate conductor layer connected to third selection gate line.

According to an eleventh aspect of the present invention, in the above-described first aspect of the present invention, the plurality of semiconductor memory cells are arranged in the matrix shape on the substrate to form memory blocks, and a plurality of the memory blocks are selected in at least one of the data write operation, the data erase operation, and the data read operation.

BRIEF DESCRIPTION OF THE DRAWINGS

FIGS. 3A, 3B, 3C, and 3D illustrate a related-art capacitorless dynamic flash memory cell including a MOS transistor.

DESCRIPTION OF THE PREFERRED EMBODIMENTS

Hereinafter, a structure and a driving method of a memory device using a semiconductor element (hereinafter, referred to as a dynamic flash memory) according to the present invention will be described with reference to the drawings.

First Embodiment

Figure 1A:
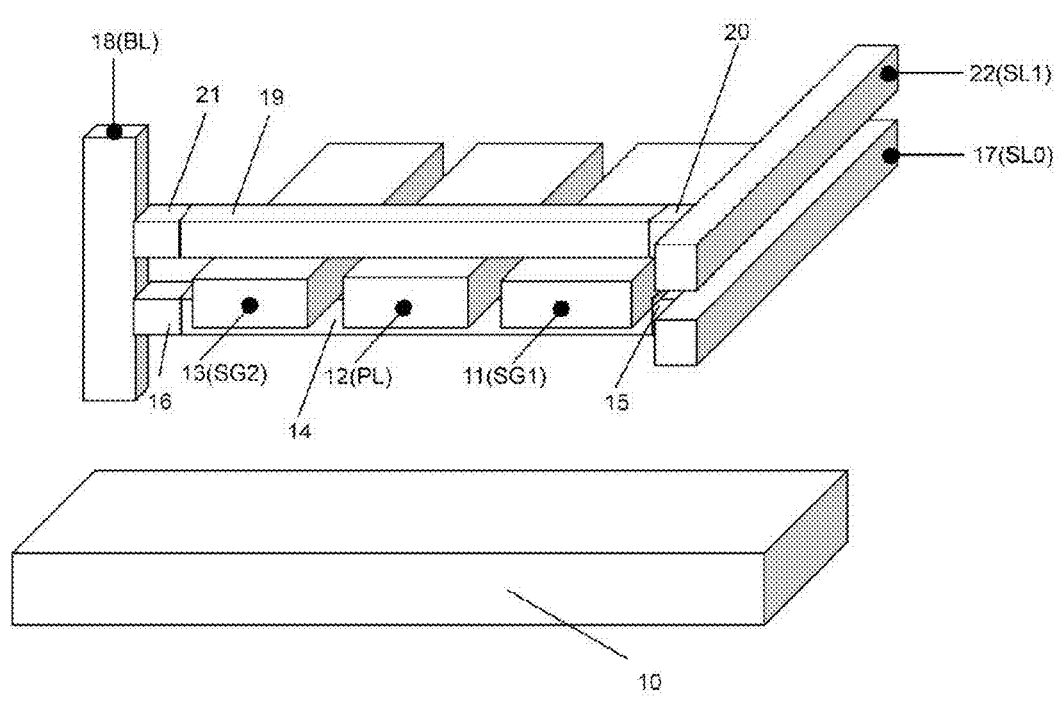
FIG. 1A illustrates a structure of memory cells according to a first embodiment.
Figure 1B:
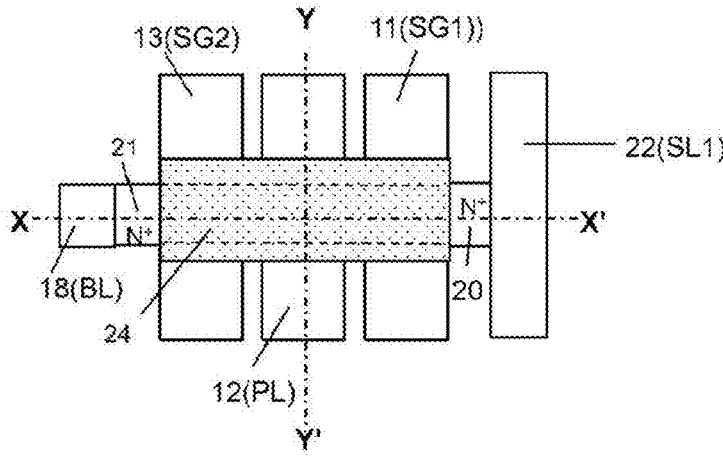
FIGS. 1BA, 1BB, and 1BC illustrate the structure of the memory cells according to the first embodiment.
Figure 1B:
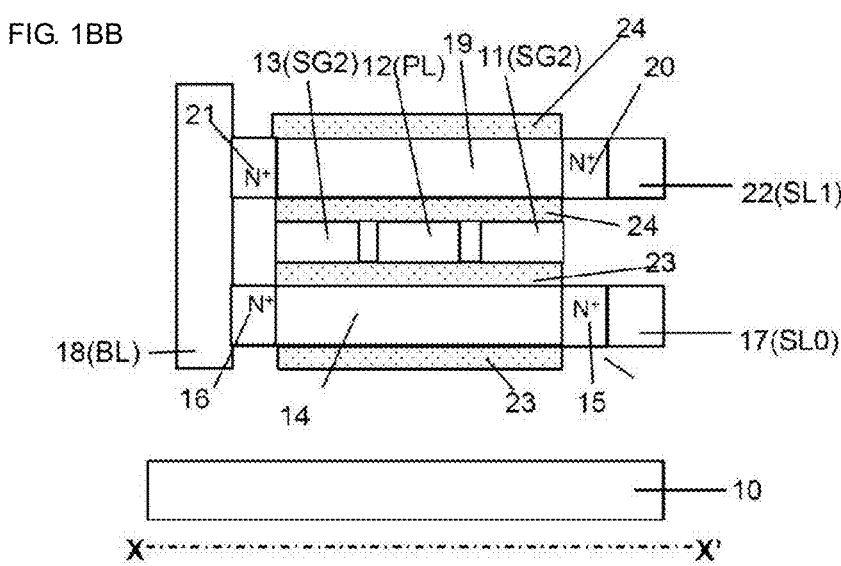
Figure 1B:
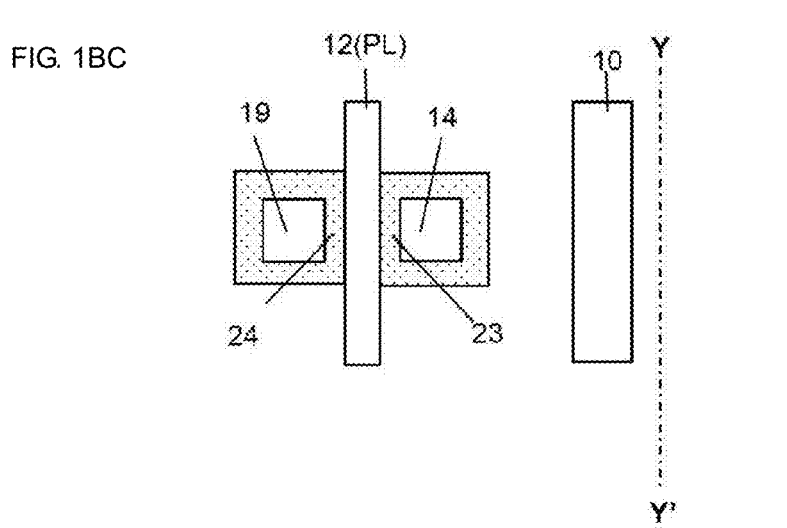
Figure 1C:
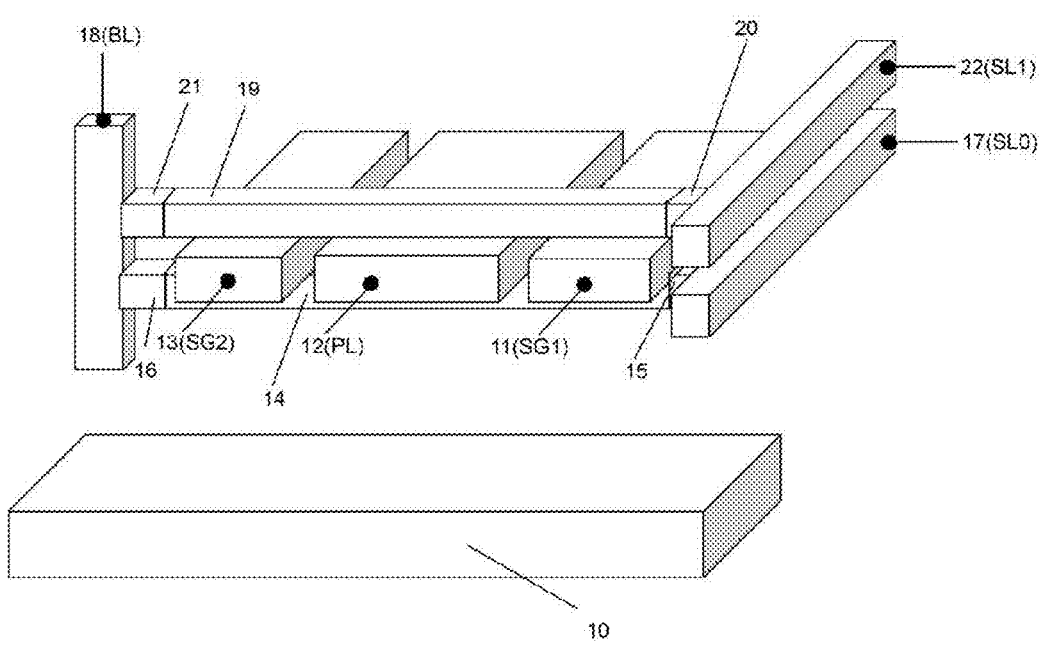
FIG. 1C illustrates a structure of the memory cells according to a first embodiment.
Figure 1D:
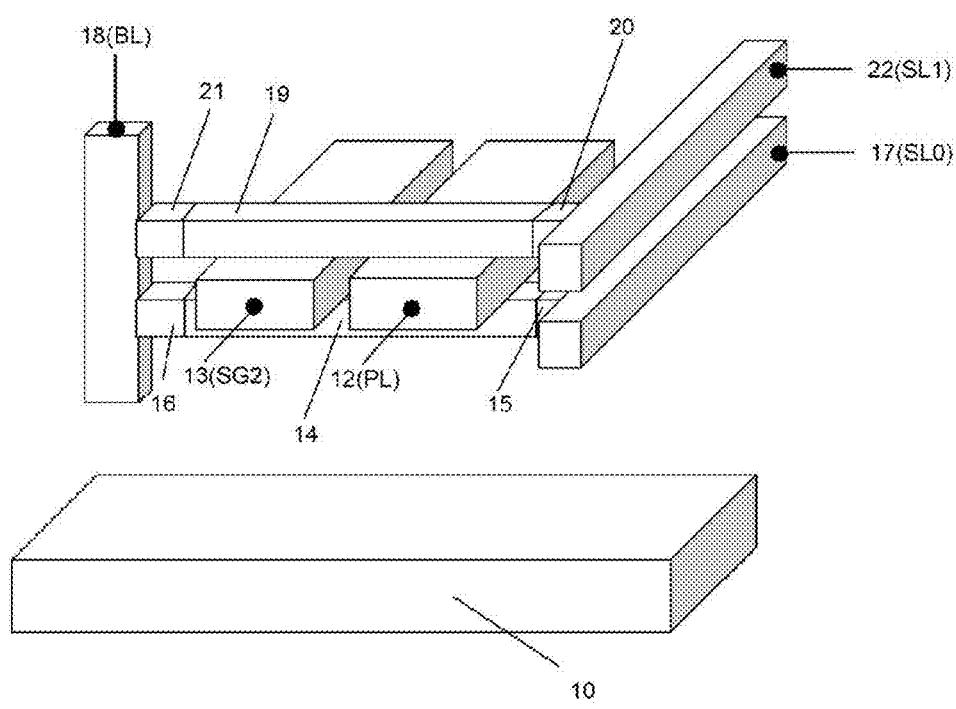
FIG. 1D illustrates a structure of the memory cells according to the first embodiment.
Figure 1E:
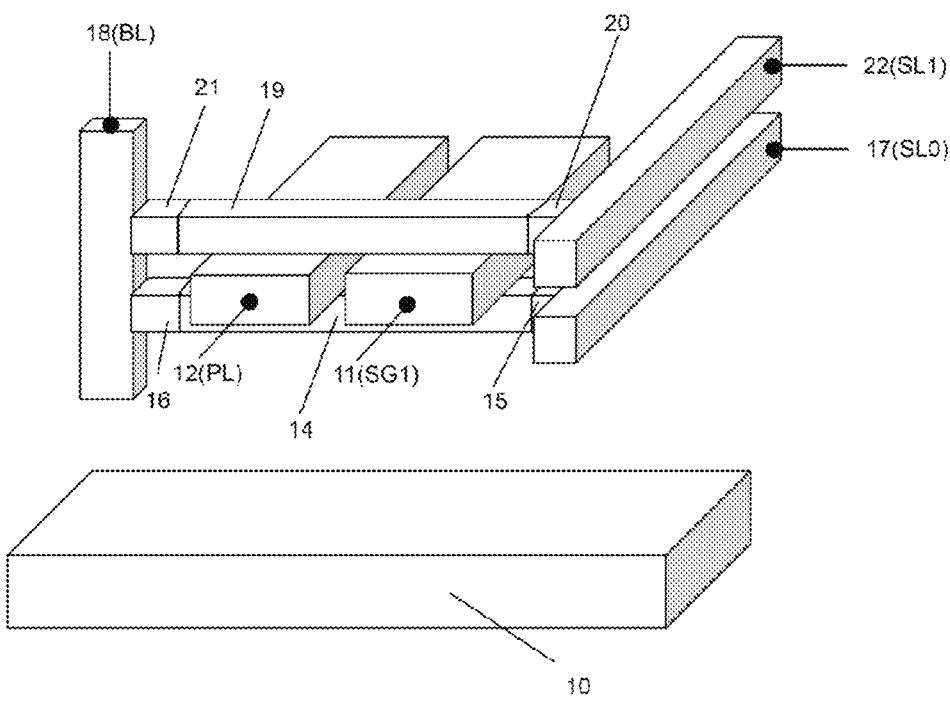
FIG. 1E illustrates a structure of the memory cells according to the first embodiment.
Figure 1F:
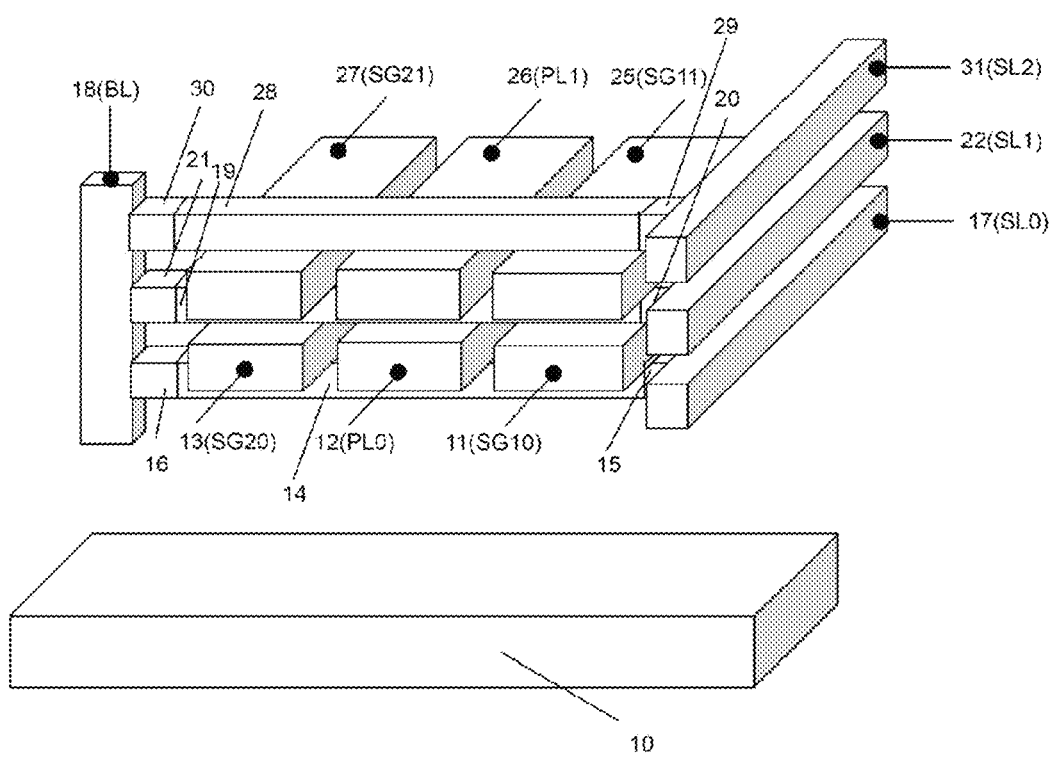
FIG. 1F illustrates a structure of the memory cells according to the first embodiment.
Figure 1G:
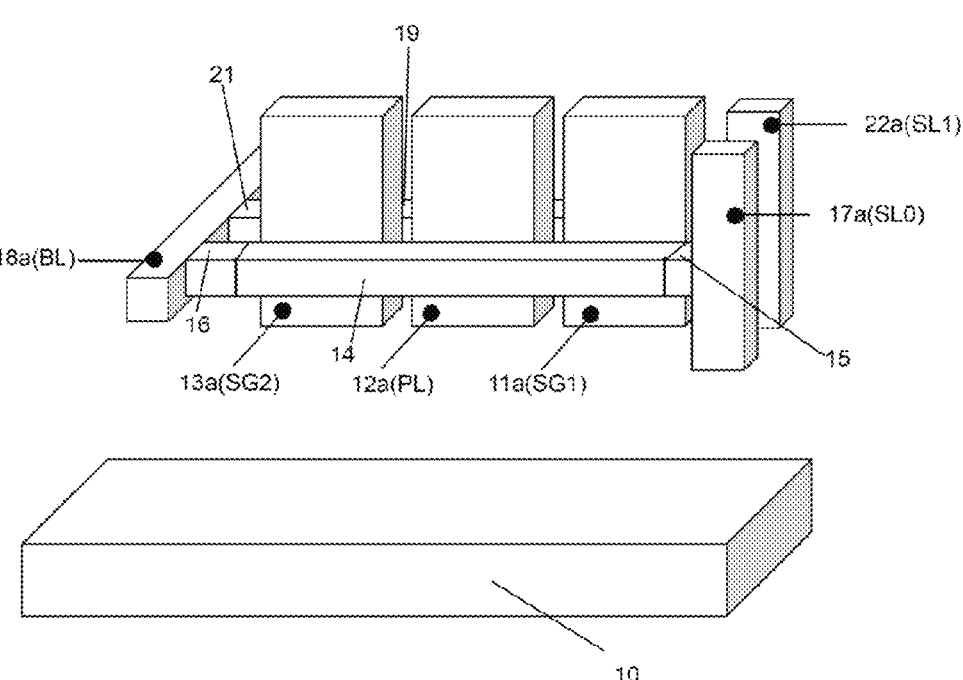
FIG. 1G illustrates a structure of the memory cells according to the first embodiment.
Figure 2A:
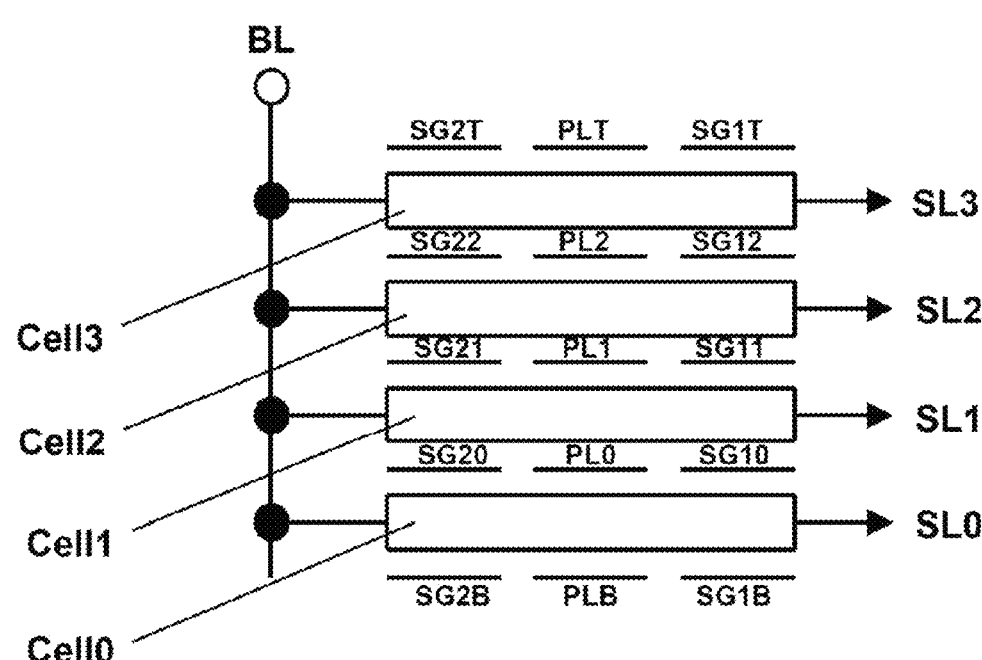
FIG. 2A is an equivalent circuit diagram of the memory cells according to the first embodiment.
Figure 2B:
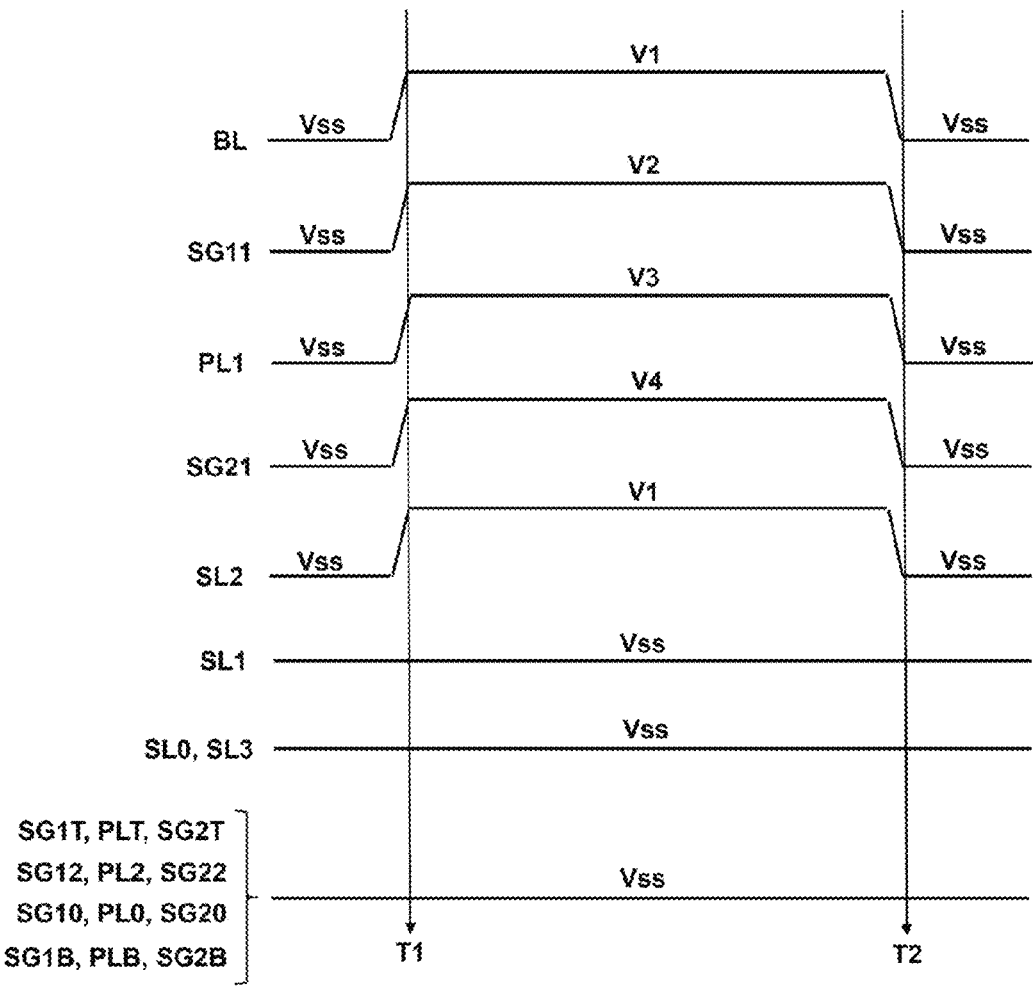
FIG. 2B illustrates operating waveforms of the memory cells according to the first embodiment.
Figure 2C:
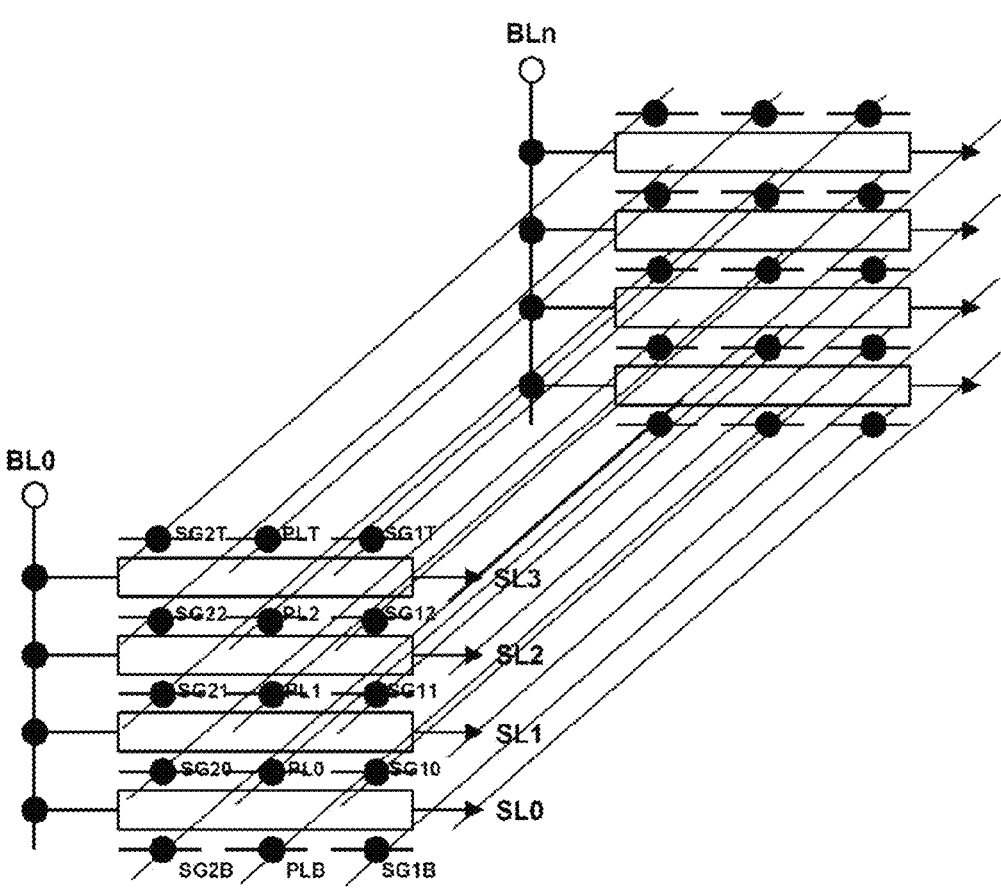
FIG. 2C illustrates a bird's-eye view in which a bit line array of the equivalent circuit diagram illustrated in FIG. 2A is increased to BLn in a depth direction.
Figure 4:
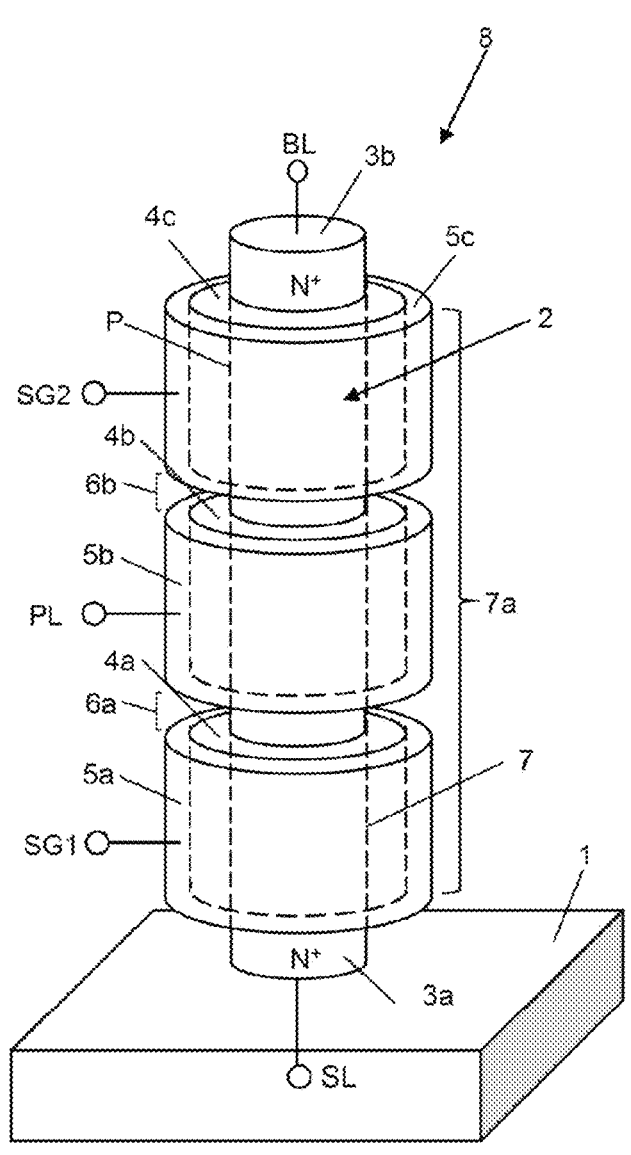
FIG. 4 illustrates a related-art capacitorless dynamic flash memory cell including a MOS transistor and three gates.

Referring to FIGS. 1A to 1G, a structure, an operation mechanism, and a manufacturing method of dynamic flash memory cells according to a first embodiment of the present invention are described. Referring to FIGS. 1A, 1BA, 1BB, and 1BC, the following structure is described: a bit line 18 (BL) is disposed perpendicular to a substrate 10; and first and second selection gate lines 11 (SG1) and 13 (SG2) and a plate line 12 (PL) are disposed parallel to the substrate 10. Referring to FIG. 1G, the following structure is described: a bit line 18a (BL) is disposed parallel to the substrate 10; and the first and second selection gate lines 11a (SG1) and 13a (SG2) and a plate line 12a (PL) are disposed perpendicular to the substrate 10. Referring to FIGS. 2A to 2C, an equivalent circuit diagram, a data write operation, a data write-protect operation, and a data read operation when four layers of the dynamic flash memory cells according to the first embodiment of the present invention are laminated in plan view or in sectional view with respect to the substrate 10 are described.

FIG. 1A illustrates a bird's-eye view of the structure of the dynamic flash memory cells according to the first embodiment of the present invention. FIG. 1BA illustrates a plan view of the structure of the dynamic flash memory cells according to the first embodiment of the present invention. FIG. 1BB illustrates a sectional view taken along line X-X' illustrated in FIG. 1BA. FIG. 1BC illustrates a sectional view taken along line Y-Y' illustrated in FIG. 1BA. A first semiconductor base 14 of a P layer (serving as an example of a "first semiconductor base" according to the present invention) extends in a first direction (serving as an example of a "first direction" according to the present invention) parallel to the substrate 10 (serving as an example of a "substrate" according to the present invention). U.S. Patent Application Publication No. 2022/0367681 A1 describes the structure in which the dynamic flash memory cells are provided parallel to the substrate 10. An N⁺ layer 15 (serving as an example of a "first impurity region" according to the present invention) and an N⁺ layer 16 (serving as an example of a "second impurity region" according to the present invention) are respectively provided at one end and the other end of the first semiconductor base 14. A second semiconductor base 19 of the P layer (serving as an example of a "second semiconductor base" according to the present invention), an N⁺ layer 20 (serving as an example of a "third impurity region" according to the present invention), and an N⁺ layer 21 (serving as an example of a "fourth impurity region" according to the present invention) are provided on an upper layer side of the first semiconductor base 14. A first gate insulating film 23 (serving as an example of a "first gate insulating film" according to the present invention) and a second gate insulating film 24 (serving as an example of a "second gate insulating film" according to the present invention) are respectively formed around the first semiconductor base 14 and the second semiconductor base 19.

A first gate conductor layer 11 (serving as an example of a "first gate conductor layer" according to the present invention), a second gate conductor layer 12 (serving as an example of a "second gate conductor layer" according to the present invention), and a third gate conductor layer 13 (serving as an example of a "third gate conductor layer" according to the present invention), which are isolated from each other, are in contact with a first side surface of the first gate insulating layer 23 (serving as an example of a "first side surface" according to the present invention) and a second side surface (serving as an example of a "second side surface" according to the present invention) of the second gate insulating layer 24. Although FIGS. 1A to 1C, 1F, 1G, 2A, and 2B illustrate the first to third gate conductor layers as three different gate conductor layers, two gate conductor layers may be used instead. Although it will be described later, one of the first gate conductor layer 11 and the third gate conductor layer 13 is not necessarily provided as illustrated in FIGS. 1D and 1E, respectively.

The first impurity region 15 and the third impurity region 20 are respectively connected to SL0 serving as a first source line 17 (serving as an example of a "first source line" according to the present invention) and SL1 serving as a second source line 22 (serving as an example of a "second source line" according to the present invention). The second impurity region 16 and the fourth impurity region 21 are connected to BL serving as the bit line 18 (serving as an example of a "bit line" according to the present invention). The first gate conductor layer 11 is connected to the second selection gate line SG1 (serving as an example of a "second selection gate line" according to the present invention), the second gate conductor layer 12 is connected to the plate line PL (serving as an example of a "plate line" according to the present invention), and the third gate conductor layer 13 is connected to a third selection gate line SG2 (serving as an example of a "third selection gate line" according to the present invention).

Five terminals of a first memory cell (serving as an example of a "first memory cell" according to the present invention) include the second selection gate line SG1, the plate line PL, the third selection gate line SG2, the first source line SL0, and the bit line BL. Five terminals of a second memory cell (serving as an example of a "second memory cell" according to the present invention) include the second selection gate line SG1, the plate line PL, the third selection gate line SG2, the second source line SL1, and the bit line BL.

For example, when the first memory cell is selected, the first source line SL0 applies a ground voltage Vss, applies a positive voltage to the bit line BL, and controls voltages applied to the plate line PL, the second selection gate line SG1, and the third selection gate line SG2, thereby to perform, on the first memory cell, the data write operation (serving as an example of a "data write operation" according to the present invention) or the data read operation (serving as an example of a "data read operation" according to the present invention). Meanwhile, the second source line SL1 applies the same voltage as the voltage applied to the bit line BL. Thus, while the data write operation on the first memory cell is performed, the data write-protect operation (serving as an example a "data write-protect operation" according to the present invention) is performed on the second memory cell. Furthermore, during the data read operation from the first memory cell, the data read operation on the second memory cell is not performed. Furthermore, voltages applied to the first source line SL0, the second source line SL1, the bit line BL, the plate line PL, the second selection gate line SG1, and the third selection gate line SG2 are controlled so as to perform a data erase operation (serving as an example of a "data erase operation" according to the present invention) on the first memory cell and the second memory cell.

As illustrated in FIG. 1B, the first to third gate conductor layers 11, 12, and 13 serve as common gate conductor layers to the two dynamic flash memory cells that use the first semiconductor base 14 and the second semiconductor base 19 as channels. It is sufficient that the first gate insulating film 23 be provided at least between the first to third gate conductor layers 11, 12, and 13 and the first semiconductor base 14. Likewise, it is sufficient that the second gate insulating film 24 be provided at least between the first to third gate conductor layers 11, 12, and 13 and the second semiconductor base 19.

FIG. 1A illustrates a case where a channel length (length in the line X-X' direction) of the plate line PL is set to be the same as channel lengths of the selection gate line SG1 and the selection gate line SG2. In contrast, as illustrated in FIG. 1C, the channel length (lengths in the line X-X' direction) of the plate line PL is set to be greater than the channel lengths of the selection gate line SG1 and the selection gate line SG2. In this way, a good controllability of a plate line voltage is obtained for floating bodies of the memory cells. Furthermore, depending on the channel length (gate length) of the plate line, more positive holes can be held in a floating body in the "1" write state.

FIG. 1D illustrates an example in which the second selection gate line SG1 adjacent to the first source line SL0 and the second source line SL1 is removed. That is, this structure includes the third selection gate line SG2 that is the first selection gate line (serving as an example of a "first selection gate line" according to the present invention) not divided and the plate line PL. FIG. 1E illustrates an example in which the third selection gate line SG2 adjacent to bit lines BL0 and BL1 is removed. That is, this structure includes the second selection gate line SG1 that is the first selection gate line not divided and the plate line PL. In this way, a cell size of the dynamic flash memory cell can be further miniaturized. Furthermore, a cell current can be increased, and the speed can be further increased. Although there is a drawback of reducing a data retention capability due to removal of one of the selection gates, the good controllability of the plate line voltage is obtained for the floating bodies of the memory cells. Furthermore, depending on the gate length of the plate line, more positive holes can be held in the floating body in the "1" write state. Which structure to use can be selected depending on application in which the dynamic flash memory cells are used.

FIG. 1F illustrates an example in which three dynamic flash memory cells are laminated. A third semiconductor base 28 is provided above the second semiconductor base 19. A first gate conductor layer 25 connected to a selection gate line SG11, a second gate conductor layer 26 connected to a plate line PL1, and a third gate conductor layer 27 connected to a selection gate line SG21 are provided between the second semiconductor base 19 and the third semiconductor base 28. N$^+$ layers 29 and 30 are provided at one end and the other end of the third semiconductor base 28. The N$^+$ layer 29 is continuous with a source line 31 (SL2), and the N$^+$ layer 30 is continuous with the bit line 18 (BL). The first source line 17 (SL0), the second source line 22 (SL1), and the third source line 31 (SL2) are selected by using a decoder circuit (not illustrated).

FIG. 1G illustrates an example in which the second selection gate line SG1, the plate line PL, the third selection gate line SG2, and the source lines SL are disposed perpendicular to the substrate 10, and the bit line BL is disposed parallel to the substrate 10. That is, the dynamic flash memory cells illustrated in FIG. 1G correspond to dynamic flash memory cells obtained by rotating the dynamic flash memory cells illustrated in FIGS. 1A to 1F by 90 degrees toward a depth direction of the pages of the drawings relative to the substrate 10. Although any of the dynamic flash memory cells can be selected depending on the application in which the dynamic flash memory cells are used, main features of the dynamic flash memory cells illustrated in FIG. 1G are the same as those of the dynamic flash memory cells illustrated in FIGS. 1A to 1F.

FIG. 2A illustrates an equivalent circuit diagram when four memory cells Cell 0 to Cell 3 of the dynamic flash memory cells according to the first embodiment of the present invention are laminated with respect to the substrate in plan view or in sectional view. FIG. 2B illustrates operating waveforms of the data write operation, the data write-protect operation, the data read operation of the four memory cells Cell 0 to Cell 3. At a first time T1, voltages of the bit line BL, the second selection gate line SG11, the plate line PL1, the third selection gate line SG21, the second source line SL1 are respectively changed from the ground voltage Vss to a first voltage V1, a second voltage V2, a third voltage V3, a fourth voltage V4, and the first voltage V1, and the voltage of the second source line SL1 is set to the ground voltage Vss. As a result, the second memory cell Cell 1 is selected and the data write operation or the data read operation is performed on the second memory cell Cell 1.

Furthermore, when the first voltage V1 that is the same voltage as the voltage of the bit line BL is applied to the third source line SL2 in the third memory cell Cell 2, the data write operation is performed on the second memory cell Cell 1, and the data write-protect operation is performed on the third memory cell Cell 2. When the data read operation is performed on the second memory cell Cell 1, the data read operation is not performed on the third memory cell Cell 2. That is, multi-selection of the second memory cell Cell 1 and the third memory cell Cell 2 is prohibited.

In addition, in FIG. 2B, lines SG10, PL0, and SG20 are grounded at the ground voltage Vss when the second memory cell Cell1 is subject to a data write operation or a data read operation. As a result, the side of the semiconductor body of the P layer of the second memory cell Cell1 that faces lines SG11, PL1, and SG21 is shielded by lines SG10, PL0, and SG20, which are grounded at the ground voltage Vss. Therefore, holes in the semiconductor body of the P layer of the second memory cell Cell1 gather on this shielded side, enabling a more stable and reliable data write operation or read. Note that the ground voltage Vss is zero volts, or any voltage between negative and positive voltages.

FIG. 2C illustrates a bird's-eye view in which a bit line array of the equivalent circuit diagram illustrated in FIG. 2A is increased to BLn in the depth direction. For example, when n in BLn is 1023, the number of the bit line arrays is 1024. The data write operation from a sense amplifier circuit to these bit line arrays is simultaneously performed, or the data read operation from these bit line arrays to the sense amplifier circuit is simultaneously performed.

The dynamic flash memory cells illustrated in FIGS. 1A to 1G and 2A to 2C have been described using the shapes in which the configurational items have rectangular vertical sections. However, these vertical sectional shapes may be other shapes such as, for example, trapezoidal shapes. Furthermore, the different elements may have different vertical sections. These are applied to the other embodiments in the same manner.

Furthermore, also in a structure in which the conductivities of the semiconductor bases of the N$^+$ layers 15, 16, 20, and 21 and the P layers 14 and 19 of the dynamic flash memory cells illustrated in FIGS. 1A, 1BA, 1BB and 1BC are reversed, the operations of the dynamic flash memory are performed. In this case, in the semiconductor base of the N type, the majority carrier is electrons. Accordingly, an electron group generated due to impact ionization is stored in the floating body, and a "1" state is set. Furthermore, a dynamic flash memory cells using a P-type semiconductor base and an N-type semiconductor base may be formed on the same substrate. These are applied to the other embodiments in the same manner.

Furthermore, a junctionless structure may be used. In the junctionless structure, the conductivities of the semiconductor bases of the N$^+$ layers 15, 16, 20, and 21 and the P layers 14 and 19 of the dynamic flash memory cells illustrated in FIGS. 1A, 1BA, 1BB and 1BC are the same. This is applied to the other embodiments in the same manner.

Furthermore, the dynamic flash memory cells illustrated in FIGS. 1A to 1G and 2A to 2C may be arranged in a matrix shape on the substrate and form memory blocks. In this case, a plurality of memory blocks are selected in at least one of the data write operation, the data erase operation, and the data read operation. As a result, the number of memory cells selected in the plurality of memory blocks increases, and accordingly, the data writing time per cell, data erasing time per cell, and data read time per cell can be further reduced.

The present embodiment has the following features.
Features

According to the embodiment of the present invention, the dynamic flash memory cells share the second selection gate line SG1, the plate line PL, and the third selection gate line SG2 of two laminated memory cells. This reduces the aspect ratio of the plurality of laminated memory cells. Thus, the number of the memory cells able to be laminated can be further increased, and the reduction of the cost can be realized. This is similarly applied to the memory cells illustrated in FIGS. 1C to 2C. By independently operating the first source line SL0 and the second source line SL1 of two laminated memory cells Cell 0 and Cell 1, during the data write operation on one of the memory cells, the other memory cell is in the data write-protect operation. Furthermore, when the data read operation is performed on one of the memory cells, the data read operation on the other memory cell is not performed.

Other Embodiments

The gate conductor layer continuous with the plate line may be a single layer or a combination of a plurality of conductor material layers. Likewise, the gate conductor layers continuous with the second selection gate line and the third selection gate line may be a single layer or a combination of a plurality of conductor material layers. Furthermore, an outer side of the gate conductor layer may be continuous with a wiring metal layer of, for example, W or the like. These are similarly applied to the other embodiments according to the present invention.

Furthermore, as the voltage of the plate line PL in the description of the embodiment, for example, a fixed voltage of 0 V may be applied regardless of the operation modes. As the voltage of the plate line PL, a fixed voltage or a time-varying voltage may be applied as long as the voltage to be applied satisfies the conditions under which the operations of the dynamic flash memory can be performed.

Furthermore, referring to FIG. 1A to 1G, an N-type or P-type impurity region may be provided between the first impurity region N$^+$ layer 15 and/or the second impurity region N$^+$ layer 16 and the first semiconductor base P layer 14. This is similarly applied to the other embodiments according to the present invention.

Furthermore, according to the description, the positive hole group being a majority carrier is generated by the impact ionization. However, for example, the positive hole group may be generated by a different method such as a gate induced drain leakage current (GIDL current).

Furthermore, in the data read operation, the data read operation may be performed by a different method such as a bipolar operation.

In addition, various embodiments and modifications of the present invention can be made without departing from the broad spirit and scope of the present invention. Each of the embodiments described above is for describing an example of the present invention and does not limit the scope of the present invention. The above-described examples and modifications can be arbitrarily combined with each other. Furthermore, embodiments from which a subset of constituent features of the embodiments are removed according to necessity also fall within the technical idea of the present invention.

With the memory device using the semiconductor element according to the present invention, high-density high-performance dynamic flash memory can be obtained.

What is claimed is:

1. A memory device using a semiconductor element, wherein a plurality of semiconductor memory cells including a first memory cell and a second memory cell are arranged on a substrate, wherein the first memory cell includes a first semiconductor base extending in a first direction parallel to the substrate, and a second memory cell includes a second semiconductor base separated from the first semiconductor base in a vertical direction or a horizontal direction, the second semiconductor base overlapping the first semiconductor base in plan view when the second semiconductor base is separated from the first semiconductor base in the vertical direction, the second semiconductor base being at a position overlapping the first semiconductor base in sectional view when the second semiconductor base is separated from the first semiconductor base in the horizontal direction, wherein the memory device includes a first impurity region and a second impurity region respectively continuous with one end and another end of the first semiconductor base, a third impurity region and a fourth impurity region respectively continuous with one end and another end of the second semiconductor base, a first gate insulating layer in contact with a side surface out of side surfaces of the first semiconductor base facing the second semiconductor base, a second gate insulating layer in contact with a side surface out of side surfaces of the second semiconductor base facing the first semiconductor base, and one or two first gate conductor layers and one or two second gate conductor layers, each of the first gate conductor layers being in contact with the first and second gate insulating layers, each of the second gate conductor layers being in contact with the first and second gate insulating layers, the first gate conductor layer and the second gate conductor layer being arranged in the first direction and isolated from each other, wherein the first to fourth impurity regions and the first and second gate conductor layers are configured to control voltages applied to the first to fourth impurity regions and the first and second gate conductor layers so as to perform, on one of the first and second semiconductor bases, a data write operation that causes a part or an entirety of a positive hole group or an electron group serving as a major carrier to remain in the one of the first and second semiconductor bases, on another of the first and second semiconductor bases during the data write operation, a data write-protect operation that prohibits remaining of the part or the entirety of the positive hole group or the electron group in both or one of the first and second semiconductor bases, a data erase operation that discharges the remaining positive hole group or the remaining electron group from one or both of the first and second impurity regions and one or both of the third and fourth impurity regions, and a data read operation that, by using storage data of a data write state or a data erase state in one of the first and second semiconductor bases, causes a current to flow through the first or second semiconductor base or prohibits flowing of the current through the first or second semiconductor base, wherein the first impurity region is connected to a first source line, the third impurity region is connected to a second source line, and the second and fourth impurity regions are connected to a bit line, and wherein, in the data read operation, a voltage applied to the first or second source line and a voltage applied to the bit line are identical to each other.

2. The memory device according to claim 1, wherein one of the first gate conductor layer and the second gate conductor layer is connected to a first selection gate line and another of the first gate conductor layer and the second selection gate layer is connected to a plate line, and wherein voltages applied to the first and second source lines, the bit line, the plate line, and a selection gate line are controlled so as to perform the data erase operation, the data write operation, and the data read operation.

3. The memory device according to claim 2, wherein, in the data write-protect operation, the voltage applied to the first or second source line and the voltage applied to the bit line are identical to each other.

4. The memory device according to claim 2, wherein, in the data read operation, the voltage applied to the first or second source line and the voltage applied to the bit line are identical to each other.

5. The memory device according to claim 2, wherein the first and second semiconductor bases overlap each other in sectional view of the substrate, and the plate line and the selection gate line are disposed parallel to the substrate such that the plate line and the selection gate line are perpendicular to the substrate in plan view.

6. The memory device according to claim 2, wherein the bit line is perpendicular to the plate line and the selection gate line in perpendicular sectional view relative to the substrate, and the first and second source lines are perpendicularly disposed in plan view so as to be parallel to the plate line and the selection gate line.

7. The memory device according to claim 2, wherein the first and second semiconductor bases overlap each other in plan view of the substrate, and the plate line and the selection gate line are disposed parallel to the substrate such that the plate line and the selection gate line are perpendicular to the substrate in sectional view.

8. The memory device according to claim 2, wherein the bit line is perpendicular to the plate line and the selection gate line in plan view relative to the substrate, and the first and second source lines are perpendicularly disposed in sectional view so as to be parallel to the plate line and the selection gate line.

9. The memory device according to claim 2, wherein the first selection gate line includes an isolated second selection gate line and an isolated third selection gate line, wherein one of the first gate conductor layer and the second gate conductor layer is divided into two gate conductor layers, wherein one of the divided gate conductor layers is connected to the second selection gate line and another of the divided gate conductor layers is connected to the third selection gate line, wherein the first gate conductor layer or the second gate conductor layer that has not been divided is connected to the plate line, and wherein the gate conductor layer connected to the second selection gate line and the gate conductor layer connected the third selection gate line are disposed on one side and another side of the gate conductor layer connected to the plate line.

10. The memory device according to claim 9, wherein a channel length of the gate conductor layer connected to the plate line is greater than a channel length of the gate conductor layer connected to the second selection gate line and a channel length of the gate conductor layer connected to third selection gate line.

11. The memory device according to claim 1, wherein the plurality of semiconductor memory cells are arranged in a matrix shape on the substrate to form memory blocks, and a plurality of the memory blocks are selected in at least one of the data write operation, the data erase operation, and the data read operation.

12. The memory device according to claim 1, wherein the first to fourth impurity regions and the first and second gate conductor layers are configured so as to perform the data write operation that causes the part or the entirety of the positive hole group or the electron group serving as the major carrier to remain in the first or second semiconductor base, the positive hole group or the electron group being generated by impact ionization due to a current flowed through the one of the first and second semiconductor bases or a gate induced drain leakage current, on another of the first and second semiconductor bases during the data write operation, the data write-protect operation that prohibits, by not causing the impact ionization or not flowing the gate induced drain leakage current, remaining of the part or the entirety of the positive hole group or the electron group serving as the major carrier in the first or second semiconductor base, the data erase operation that discharges the remaining positive hole group or the remaining electron group from one or both of the first and second impurity regions and one or both of the third and fourth impurity regions, and the data read operation that, by using the storage data of the data write state or the data erase state of one of the first and second semiconductor bases, causes the current to flow through the first or second semiconductor base or prohibits flowing of the current through the first or second semiconductor base.

13. A memory device comprising:

alternately stacked semiconductor tiers and conductor tiers one tier next to another tier in which each semiconductor tier includes a N number of semiconductor bases arranged in parallel to each other in their lengths, and each conductor tire includes a M number of gate conductor layers arranged in parallel to each other in their lengths, and in orthogonal to the semiconductor bases of the semiconductor tiers, wherein each semiconductor base includes a pair of first and second impurity regions formed respectively at ends of the semiconductor base, each semiconductor base is defined with at least three sections arranged in the length direction of the semiconductor base, and the at least three sections are surrounded, respectively, by mutually electrically isolated gate insulating layers, and each gate conductor layer in the conductor tiers is formed in contact in common with two corresponding gate insulating layers of two immediately adjacent semiconductor tiers.

14. The memory device according to claim 13, further comprising:

a bit line formed in electrical contact in common with the first impurity layers of the semiconductor bases in all the semiconductor tiers; and the N number of source lines formed in electrical contact, respectively, with the second impurity layers, wherein the source lines are formed to be operated separately and individually to select one semiconductor base for writing and reading.

15. The memory device according to claim 14, further comprising:

at least one selection gate line formed in connection with one of the gate conductor layers in a respective tier; and at least one plate line formed in connection with one
 another of the gate conduct layers in the respective tier.

\* \* \* \* \*